United States Patent [19]
Ota

[11] Patent Number: 6,034,349
[45] Date of Patent: Mar. 7, 2000

[54] LASER MACHINING SYSTEM FOR SEQUENTIAL IRRADIATION OF MACHINING POINTS

[75] Inventor: Kazuo Ota, Hiratsuka, Japan

[73] Assignee: Komatsu Ltd., Tokyo, Japan

[21] Appl. No.: 09/084,150

[22] Filed: May 26, 1998

[30] Foreign Application Priority Data

May 28, 1997 [JP] Japan ................................ 9-138634
Jul. 9, 1997 [JP] Japan ................................ 9-184019

[51] Int. Cl.[7] ................................ B23K 26/073
[52] U.S. Cl. ................................ 219/121.73; 219/121.8; 219/128.68; 219/121.7; 219/121.85
[58] Field of Search .......... 219/121.61, 121.62, 219/121.68, 121.7, 121.71, 121.8, 121.81, 121.73, 121.82, 121.85, 121.6; 264/400

[56] References Cited

U.S. PATENT DOCUMENTS

| | | | |
|---|---|---|---|
| 4,543,464 | 9/1985 | Takeuchi | 219/121.68 |
| 5,037,183 | 8/1991 | Gagosz et al. | 219/121.7 X |
| 5,073,687 | 12/1991 | Inagawa et al. | 219/121.7 |
| 5,168,454 | 12/1992 | LaPlante et al. | 364/474.08 |
| 5,302,798 | 4/1994 | Inagawa et al. | 219/121.7 |

FOREIGN PATENT DOCUMENTS

| | | | |
|---|---|---|---|
| 56-4391 | 1/1981 | Japan | 219/121.71 |
| 6-99297 | 4/1994 | Japan . | |

*Primary Examiner*—Gregory Mills
*Attorney, Agent, or Firm*—Welsh & Katz, Ltd.

[57] ABSTRACT

A laser machining system for machining a plurality of different machining spots on a work, which comprises a laser oscillator for generating laser light; a laser light scanner for deflecting the laser light generated from the laser oscillator so as to sequentially irradiate the laser light to the plurality of variable machining spots on the work; an irradiation time setting member for determining previously a laser irradiation time for machining one machining spot on the work in one operation; and a controller for controlling the laser light scanner to sequentially move the machining spots in a time division fashion so that the laser irradiation time to machine each machining spot in one operation does not exceed the determined irradiation time. Thus, this laser machining system can perform laser machining with high precision at a machining rate as high as possible with a thermal effect prevented.

14 Claims, 9 Drawing Sheets

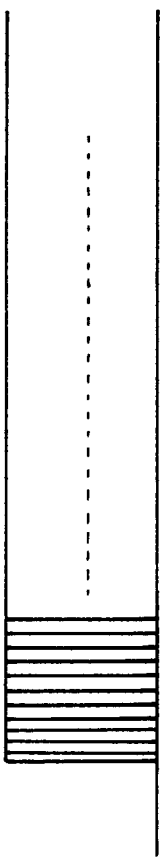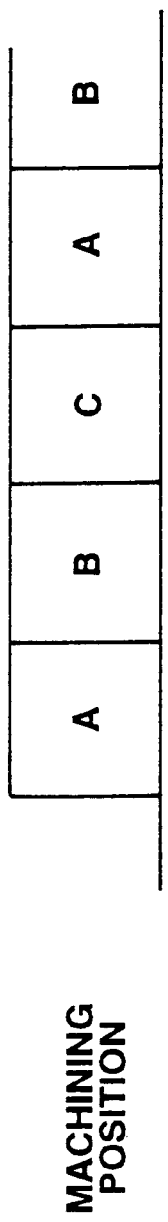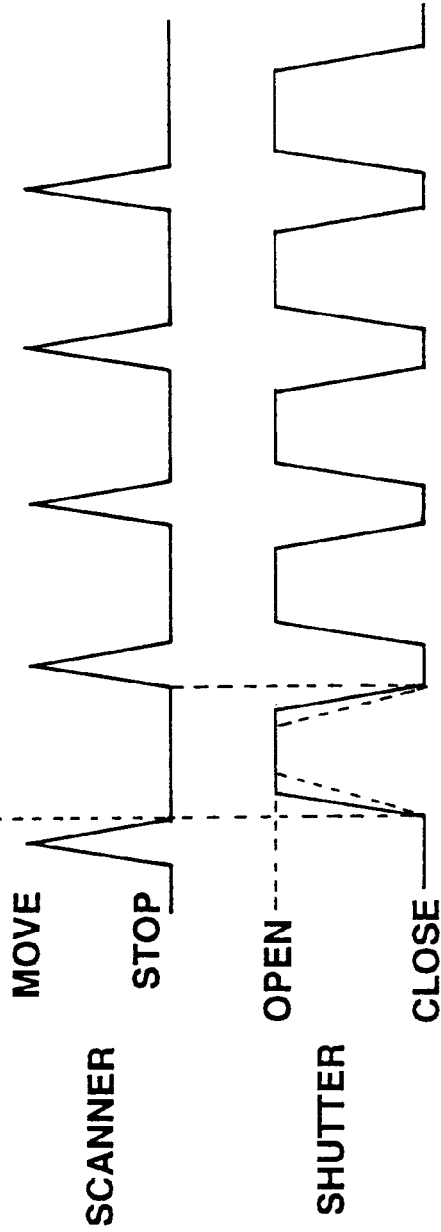
FIG.4(a) LASER OUTPUT
FIG.4(b) MACHINING POSITION
FIG.4(c) SCANNER MOVE/STOP
FIG.4(d) SHUTTER OPEN/CLOSE

LASER MACHINING SYSTEM FOR SEQUENTIAL IRRADIATION OF MACHINING POINTS

TECHNICAL FIELD

The invention relates to a laser machining system for machining such as drilling and cutting of polymer materials, ceramics, composite materials and the like using lasers, and more particularly to improvement of such a laser machining system to prevent machining precision from being degraded due to heat generated when machining.

BACKGROUND ART

For conventional laser machining such as drilling and cutting, infrared laser such as $CO_2$ laser is generally used. But, cutting using the infrared laser has disadvantages that the periphery of a cut portion has heat distortion, thermal property change and limited machining precision because such cutting is made by vaporizing and melting the cutting portion by heat.

Instead, drilling and cutting using UV laser light (ultraviolet laser light) of harmonics of excimer laser and YAG laser are attracting attention these days.

The laser cutting using the UV laser light, which does not use the laser beams as heat energy, is cold cutting to cut bonding by a photochemical reaction in resonance with laser wavelengths. Therefore, the laser cutting is basically ideal, high precision cutting free from an influence of heat and heat distortion. Especially, the excimer laser is considered suitable for drilling and cutting of polymer materials, ceramics and composite materials.

But, when the laser machining system using the UV light is operated with the repetition frequency (oscillating frequency) of pulsed oscillation raised to the neighborhood of the maximum frequency of approximately some hundreds hertz, there is a problem that machining precision is heavily lowered because of an effect of heat which was also caused in machining using the infrared laser. The cause is considered that when the repetition frequency of pulsed oscillation is increased, the UV laser machining also causes the same evaporation of a material being machined as in the infrared machining with the progress of cutting or drilling, and heated molecules of the evaporated material being machined adhere to the surface of the material being machined.

As described above, the prior art using the UV pulse laser light to drill or cut irradiates continuously the UV pulse laser light to a single machining spot until drilling or cutting is completed, and when the repetition frequency of the pulse laser light is increased to improve a machining rate, the same thermal effect as seen in the infrared laser machining occurs to heavily degrade machining precision.

In order to remedy such a drawback, the irradiation of laser light may be paused periodically, but such a method makes it meaningless to improve the machining rate by increasing the repetition frequency.

In view of the circumstances described above, the invention was completed to provide a laser machining system which can make laser machining with high precision while keeping a machining rate as high as possible and suppressing a thermal influence.

DISCLOSURE OF THE INVENTION

A first aspect of the invention relates to a laser machining system for machining a plurality of variable machining spots on a work, which comprises a laser oscillator for generating laser light; laser light scanner means for deflecting the laser light generated from the laser oscillator so as to sequentially irradiate the laser light to the plurality of variable machining spots on the work; irradiation time setting means for determining previously a laser irradiation time for machining one machining spot on the work in one operation; and control means for controlling the laser light scanner means to sequentially move the machining spots in a time division fashion so that the laser irradiation time to machine each machining spot in one operation does not exceed the determined irradiation time.

According to the first aspect of the invention, the machining spots are sequentially moved in a time division fashion so that the laser irradiation time to machine each machining spot in one operation does not exceed the predetermined irradiation time. In other words, the laser is irradiated to the pertinent machining spots for the predetermined irradiation time, the laser is irradiated at least one time to another machining spot for the predetermined irradiation time, and the laser is irradiated again to the pertinent machining spot.

Thus, the invention changes the laser irradiation to another machining spot before an influence of heat due to the continuous laser irradiation is made to the machining spot and irradiates again the laser to the machining spot after its temperature lowers. Therefore, an influence of thermal distortion to the work can be prevented without lowering the laser machining rate, and fast, high-precision laser machining can be made.

A second aspect of the invention relates to a laser machining system for machining a plurality of variable machining spots on a work, which comprises a laser oscillator for generating laser light; a movable stage which has the work placed on it and is moved to sequentially irradiate a plurality of different machining spots on the work with the laser light generated from the laser oscillator; irradiation time setting means for previously determining a laser irradiation time for machining of a single machining spot on the work in one operation; and control means for controlling the movable stage to sequentially move the machining spots in a time division fashion so that the laser irradiation time to machine each machining spot in one operation does not exceed the determined irradiation time.

According to the second aspect of the invention, the movable stage, which moves the work, is used instead of the laser light scanner of the first aspect of the invention in order to move the machining spots.

Therefore, the second aspect of the invention can also prevent an influence of thermal distortion of the work without lowering the laser machining rate and make fast, high-precision laser machining.

BRIEF DESCRIPTION OF THE DRAWINGS

FIGS. 4(a) to 4(d) are time charts showing laser machining according to the first embodiment;

BEST MODE FOR CARRYING OUT THE INVENTION

Embodiments of the invention will be described in detail with reference to the accompanying drawings.

Figure 1:
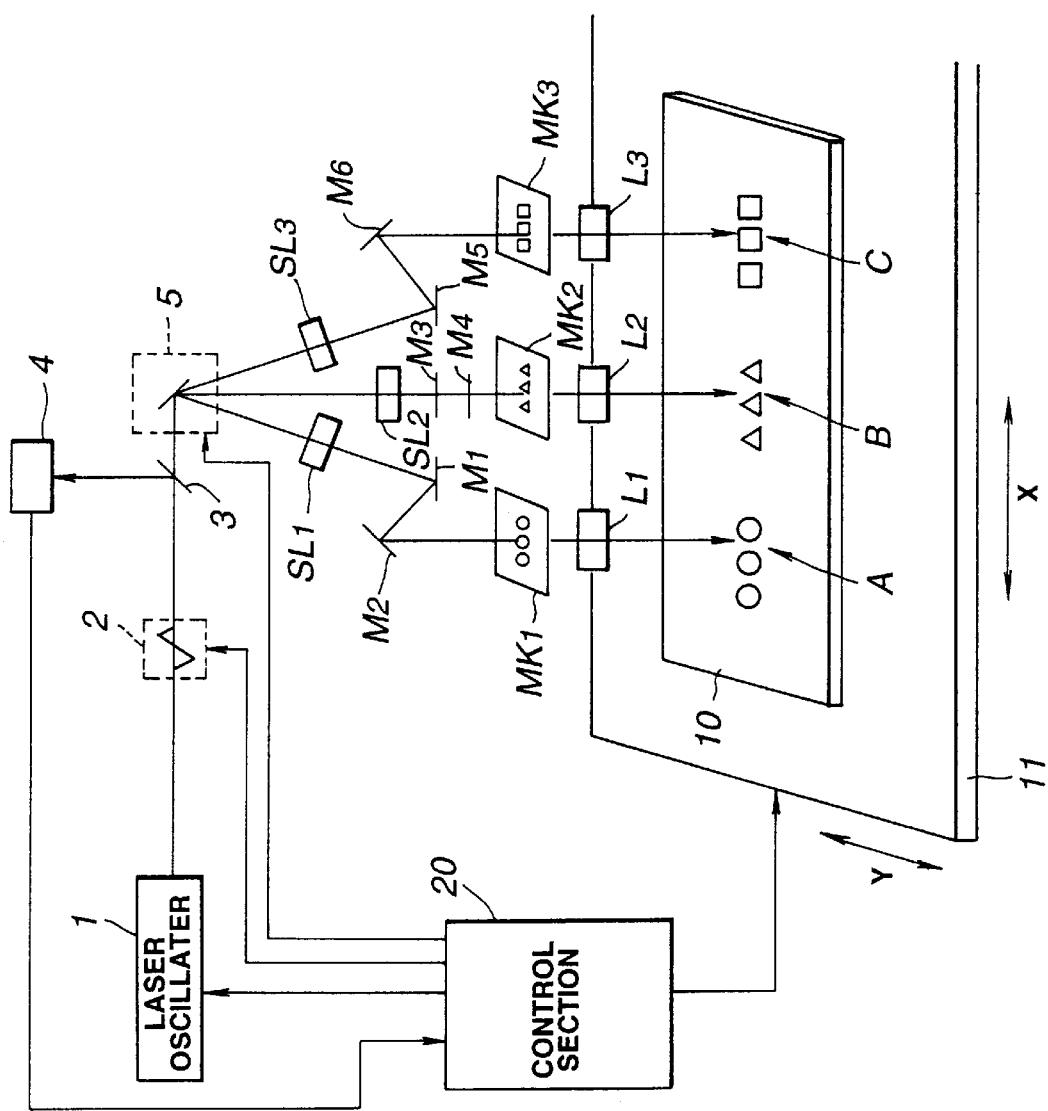
FIG. 1 is a diagram showing a first embodiment of the invention.

FIG. 1 depicts a first embodiment of the invention.

The laser machining system of the first embodiment bores holes in a work such as polymer materials, ceramics and composite materials by an excimer laser.

In FIG. 1, an excimer pulse laser light emitted from a laser head 1 of an excimer laser oscillator enters a beam splitter 3 through a shutter 2 which allows or interrupts the path of the laser light. The shutter 2 comprises a shutter using a galvanometer or a piezoelectric element for switching between allowance and interruption of the path of the laser light and switches to open and close the laser light path at the level of several milliseconds.

A portion of the laser sampled by the beam splitter 3 is directed toward a laser output sensor 4. The laser output sensor 4 comprises a photodetector and directs its output toward a control section 20. The control section 20 determines output energy E of each pulse of the emitted pulse laser light based on the output received.

The laser light through the beam splitter 3 is entered into a laser scanner 5. The path of the laser light is deflection-scanned by the laser scanner 5 so that the laser light is sequentially irradiated to a plurality of different machining spots (in this case, three machining spots A, B and C) on a work 10.

The laser scanner 5 has a mechanism of revolving a scanning mirror using a galvanometer or a piezoelectric element so as to deflect and scan the entered laser light in a given direction at high speed.

In respective light paths (three of them in this case) to be deflected by the laser scanner 5, there are disposed slits SL1 to SL3, scanner mirrors M1 to M6, beam forming masks (apertures) MK1 to MK3 having a mask pattern similar to a machining pattern and lenses L1 to L3, through which the laser light is irradiated to the work 10. Positions and angles of the scanner mirrors M1 to M6, beam forming masks (apertures) MK1 to MK3 and lenses L1 to L3 are finely adjusted by the control section 20.

The work 10 is placed on a machining table 11 movable in directions X and Y and drilled by the entered laser light.

The control section 20 controls to activate and stop the laser oscillator 1, to open and close the shutter 2, to scan by the laser scanner 5, to move the machining table 11, and to adjust finely the positions and angles of the scanner mirrors M1 to M6, beam forming masks (apertures) MK1 to MK3 and lenses L1 to L3.

Figure 2:
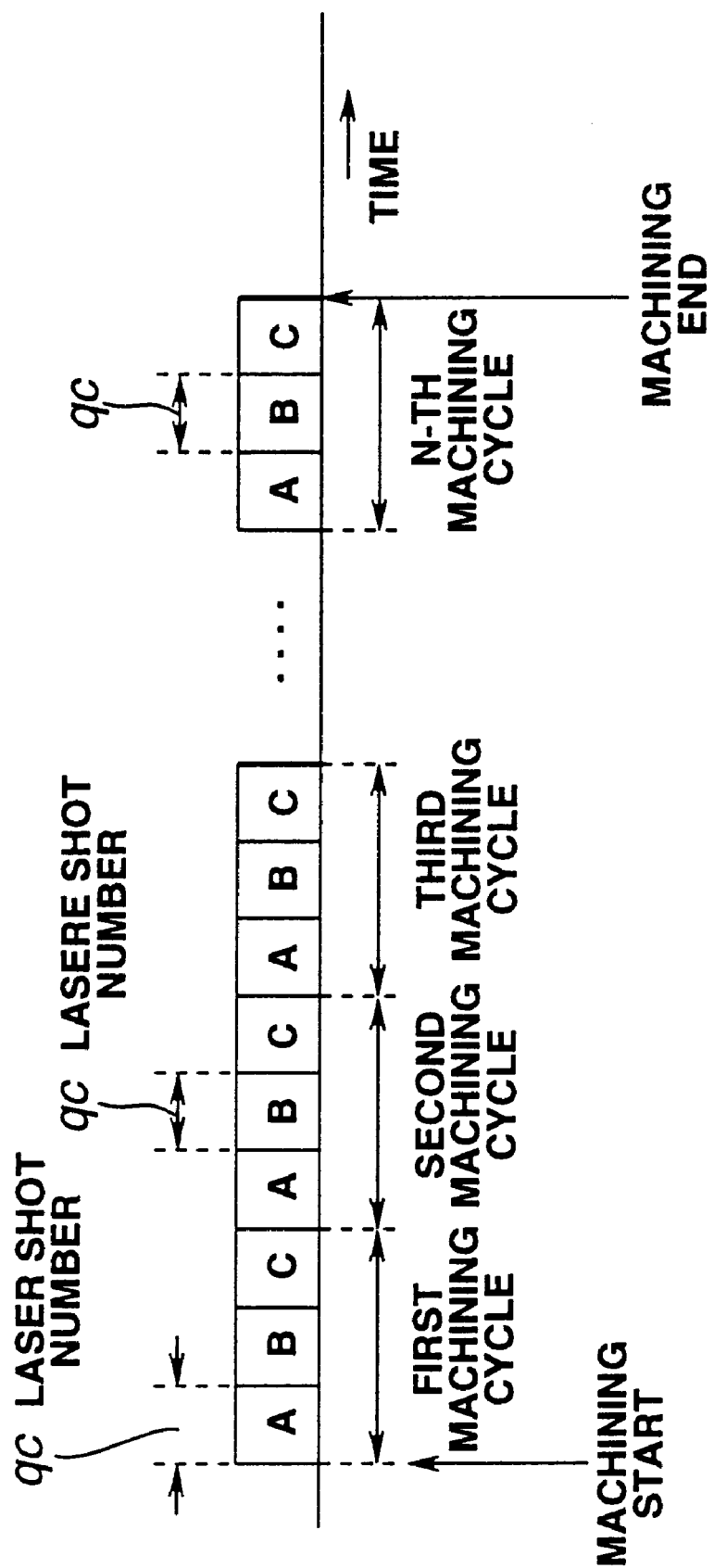
FIG. 2 is a time chart showing laser machining according to the first embodiment.

By configuring as described above, to make holes in the three machining spots A, B and C as shown in FIG. 1, the pulse laser light is emitted to the work 10 by the laser scanner 5 so as to irradiate it to the machining spots A, B and C in a time division fashion as shown in FIG. 2 with the involvement of an adverse effect by heat prevented.

Specifically, in FIG. 2, the laser shot number qc is determined in advance to continuously irradiate the laser light to drill a hole in a single machining spot for one time (one cycle). The laser shot number qc is determined to a quantity not to cause the above-described thermal effect even if the laser light is continuously irradiated to one machining spot. And the laser irradiation with the single cycle consisting of gc is repeated a plurality of times (n cycles) to form a complete hole in the single machining spot. Therefore, the total of the laser shot number Qt to the single machining spot becomes n·qc.

In other words, in FIG. 2, the pulse laser light is continuously irradiated to the machining spot A for qc; the machining spot is changed to B by the laser scanner 5 and the pulse laser light is continuously irradiated to the machining spot B for qc; then the machining spot is changed to C by the laser scanner 5 and the pulse laser light is continuously irradiated to the machining spot C for qc, thereby completing the first machining cycle. Such a machining cycle is repeated for the number of times n to drill holes at the three machining spots A, B and C.

Figure 3:
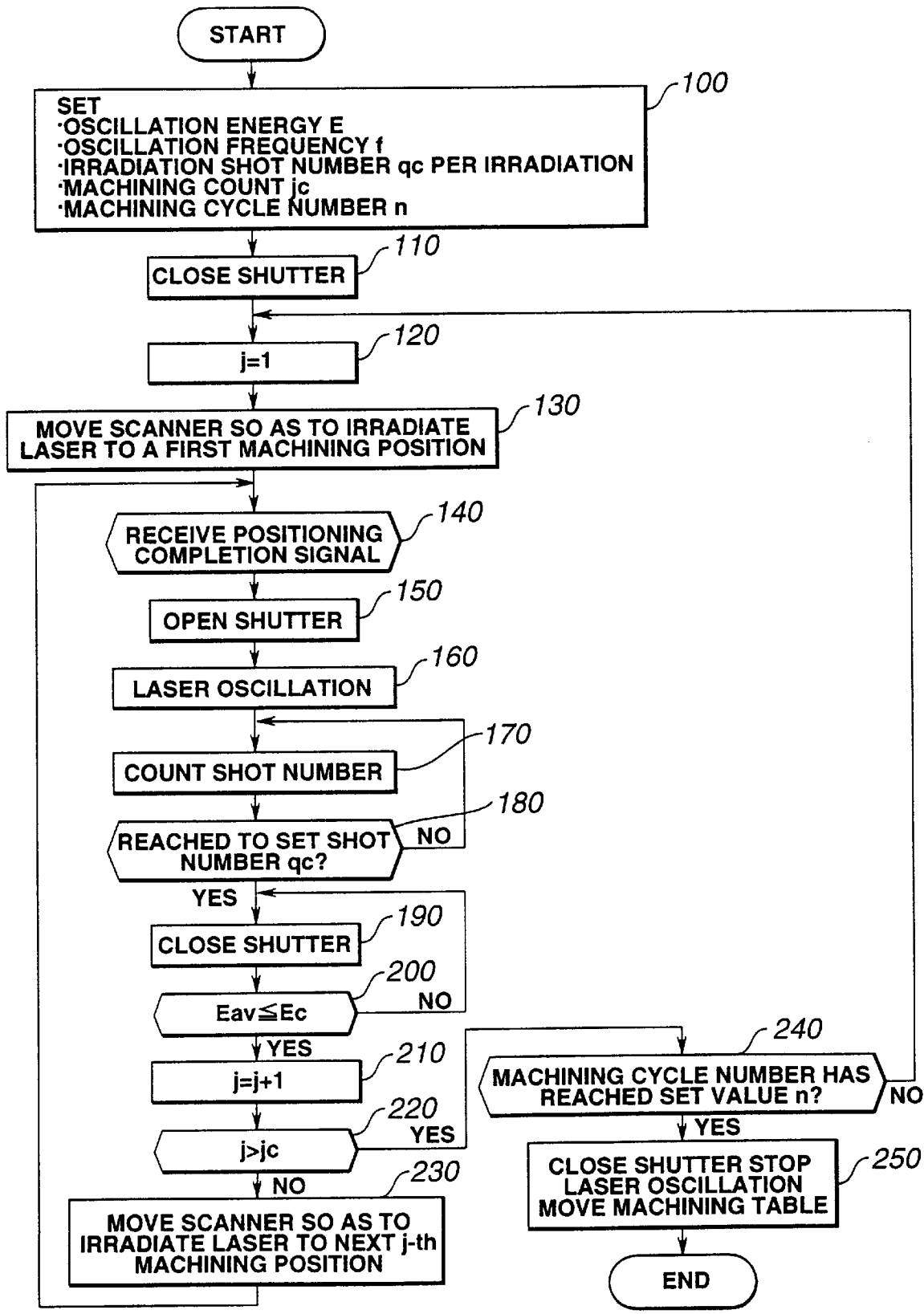
FIG. 3 is a flowchart showing laser machining according to the first embodiment.

Operation of the control section 20 for laser drilling described above will be described in detail with reference to the flowchart of FIG. 3 and the time chart of FIG. 4.

Before starting the operation, the following parameters are determined on the control section 20 (step 100).

Target value E of oscillation energy of each pulse of the laser oscillator 1.

Oscillating frequency (repetition frequency) f of the pulsed oscillation of the laser oscillator 1.

Laser shot number qc per machining of a single machining spot.

Machining count jc

Number of machining cycles n

Oscillating frequency f is determined to a maximum frequency that the laser oscillator 1 can oscillate, for example to 500 Hz, at which a conventional method had a thermal effect during machining.

Among the above parameters, the machining count jc denotes the number of machining spots. In this case, jc is 3.

After setting the parameters, the control section 20 closes the shutter 2 (step 110), and a variable parameter j indicating the machining position is determined to J=1 (step 120). It is to be understood that J=1 corresponds to the machining spot A, J=2 to the machining spot B, and J=3 to the machining spot C.

The control section 20 controls then to instruct the scanner 5 to irradiate the laser light to the first machining spot A. The scanner 5 is driven accordingly (see FIG. 4 (c)), positioned in accordance with the given instruction, then sends a positioning completion signal back to the control section 20 (steps 130, 140).

Upon receiving the positioning completion signal, the control section 20 opens the shutter 2 which was closed (see FIG. 4 (d)) and activates the laser oscillator 1 to start oscillating the pulse laser (steps 150, 160; see FIG. 4 (a)).

The pulse laser light is then irradiated to the first machining spot A of the work 10 to start making a hole there (see FIG. 4 (b)).

The control section 20 is designed to count the laser shot number after opening of the shutter 2 according to, for example, the output from the laser output sensor (photodetector) 4. By comparing the counted value with the determined laser shot number qc, the control section 20 controls to continuously irradiate the pulse laser light to the first machining spot A of the work 10 until the counted value matches the determined laser shot number qc (steps 170, 180).

Meanwhile, when the counted value reaches the determined laser shot number qc, the control section 20 starts the operation to close the shutter 2 which was open. And, even if the shutter 2 is not closed completely, when it is closed to a level sufficient to cut the laser light to an energy level not causing an effect on machining, the scanning operation by the laser scanner 5 to the next machining spot is immediately started, so that the laser machining can be effected at a higher machining rate.

Accordingly, the control section 20 compares the laser output energy detected by the laser output sensor 4 with the predetermined value E, and if the laser output energy is lower than the determined value E, controls to start scanning of the next machining position by the laser scanner 5.

Since individual pulse energy values E vary, mean value Eav of pulse energy values Ei to Ei+m of m pulses Pi to Pi+m is determined from the output of the laser output sensor 4, and when the mean value Eav is lower than the predetermined value Ec, scanning to the next machining spot is started (step 200).

When Eav≦Ec holds, the control section 20 adds 1 to the variable parameter j representing the machining position to make it 2, and judges whether the variable parameter j has exceeded the predetermined machining count jc (3 in this case) (steps 210, 220).

In step 220, when j≦jc, the laser irradiation in the pertinent machining cycle has not completed at all machining spots, and the control section 20 instructs the laser scanner 5 to change the machining spot to the j-th machining spot (the second machining position B in this case) (see FIG. 4 (c)).

Similarly, steps 140 to 230 are repeated two more times, so that the pulse laser light is irradiated to the second and third machining positions B and C of the work 10 for the predetermined laser shot number qc, respectively.

Thus, the laser irradiation in the first machining cycle is completed.

Upon completing the laser irradiation to the third machining spot C in the first machining cycle, 1 is added to the variable parameter j in step 210 to make it to j=4, so that J>jc holds in step 220. Then, the procedure is shifted to step 240.

In step 240, it is judged whether the number of machining cycles has reached the predetermined value n.

In the present stage, since the first machining cycle has merely completed, the procedure is shifted to step 120, and the laser scanner 5 is operated to scan so to irradiate the laser to the first machining spot A again (step 130). In the same way, the procedure of steps 140 to 230 is repeated three times, and the second machining cycle is conducted, in which the pulse laser light is irradiated to the first to third machining spots A, B and C of the work 10 for the predetermined laser shot number qc respectively.

And, this machining cycle is repeated n times to form predetermined holes at the first to third machining spots A, B and C of the work 10.

When the machining cycle of the n times is completed (step 240), the shutter 2 is closed by the control section 20 to stop the laser oscillation. And, when the work 10 has other machining spots, the machining table 11 is shifted, and the same operation as described above is performed.

The shutter 2 has a shutter speed diagram with rise and fall times adjustable as desired depending on machining conditions such as a machining material, a machining depth and the like as shown in FIG. 4 (d).

As described above, in the first embodiment, the machining is carried out in such a manner that the machining spots are irradiated in a time division fashion so that the number of continuous irradiations with respect to each machining spot does not exceed the predetermined value qc. Thus, an adverse effect of heat generated when an ultraviolet excimer laser light is repeatedly irradiated continuously at a high repetition frequency for a long time can be prevented, and the laser machining can be made with high precision.

Figure 5:
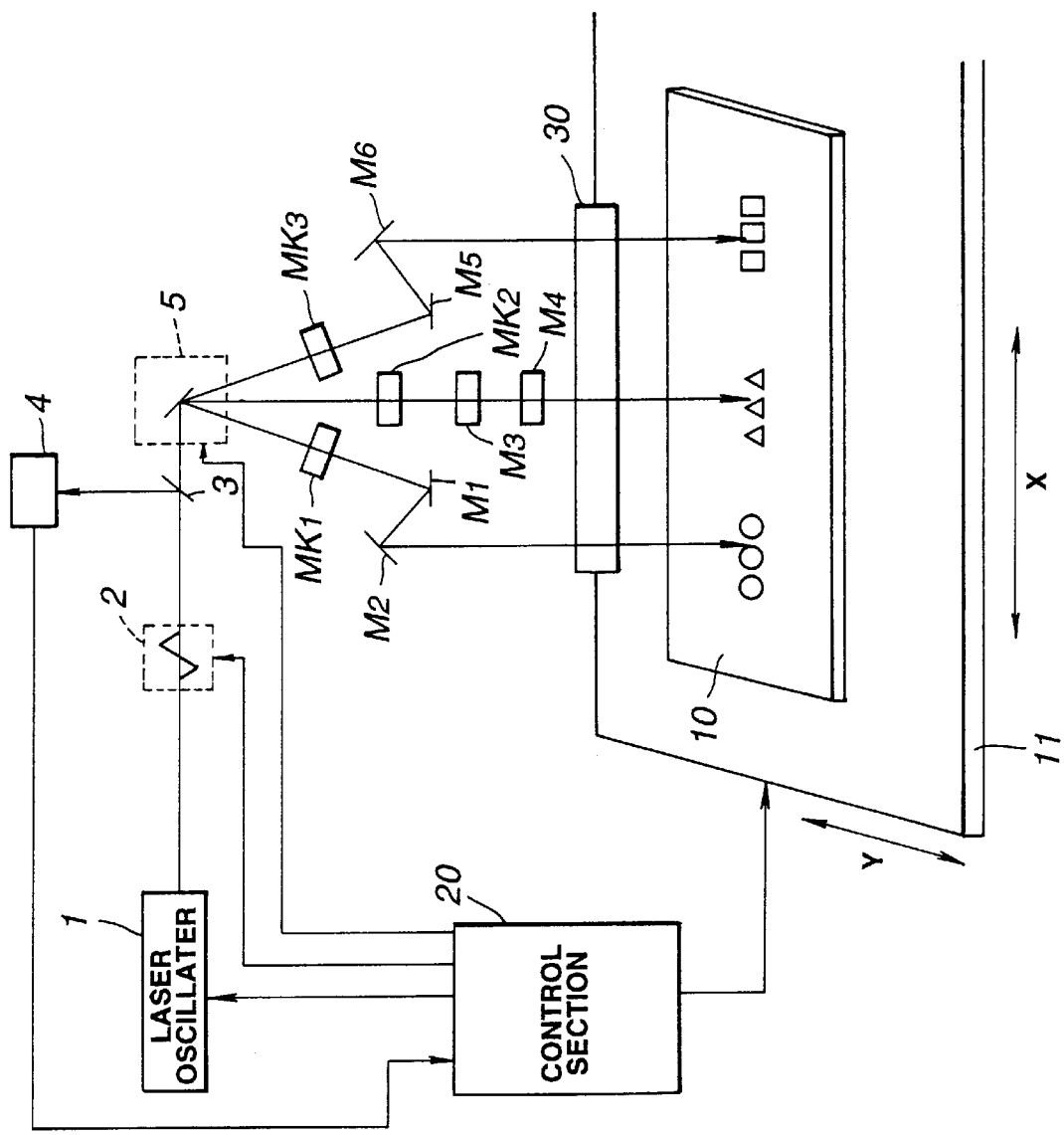
FIG. 5 is a diagram showing a second embodiment of the invention.

FIG. 5 depicts a second embodiment of the invention.

In the second embodiment, an optical system located in the laser light path from the scanner 5 to the work 10 has a different structure.

Specifically, beam forming masks MK1 to MK3 are disposed in respective light paths (three of them in this case) deflected by the laser scanner 5, scanner mirrors M1 to M6 are disposed downstream of them, and an Fθ lens 30 is disposed next so to focus the laser light on machining spots on the work proportional to deflection angles of the incident laser light.

In this embodiment, the machining spots are laser drilled in a time division fashion so that the number of continuous irradiation times with respect to each machining spot does not exceed the predetermined value qc in the same manner as in the first embodiment. Thus, an adverse effect of heat is prevented, and the laser machining can be made with high precision.

Figure 6:
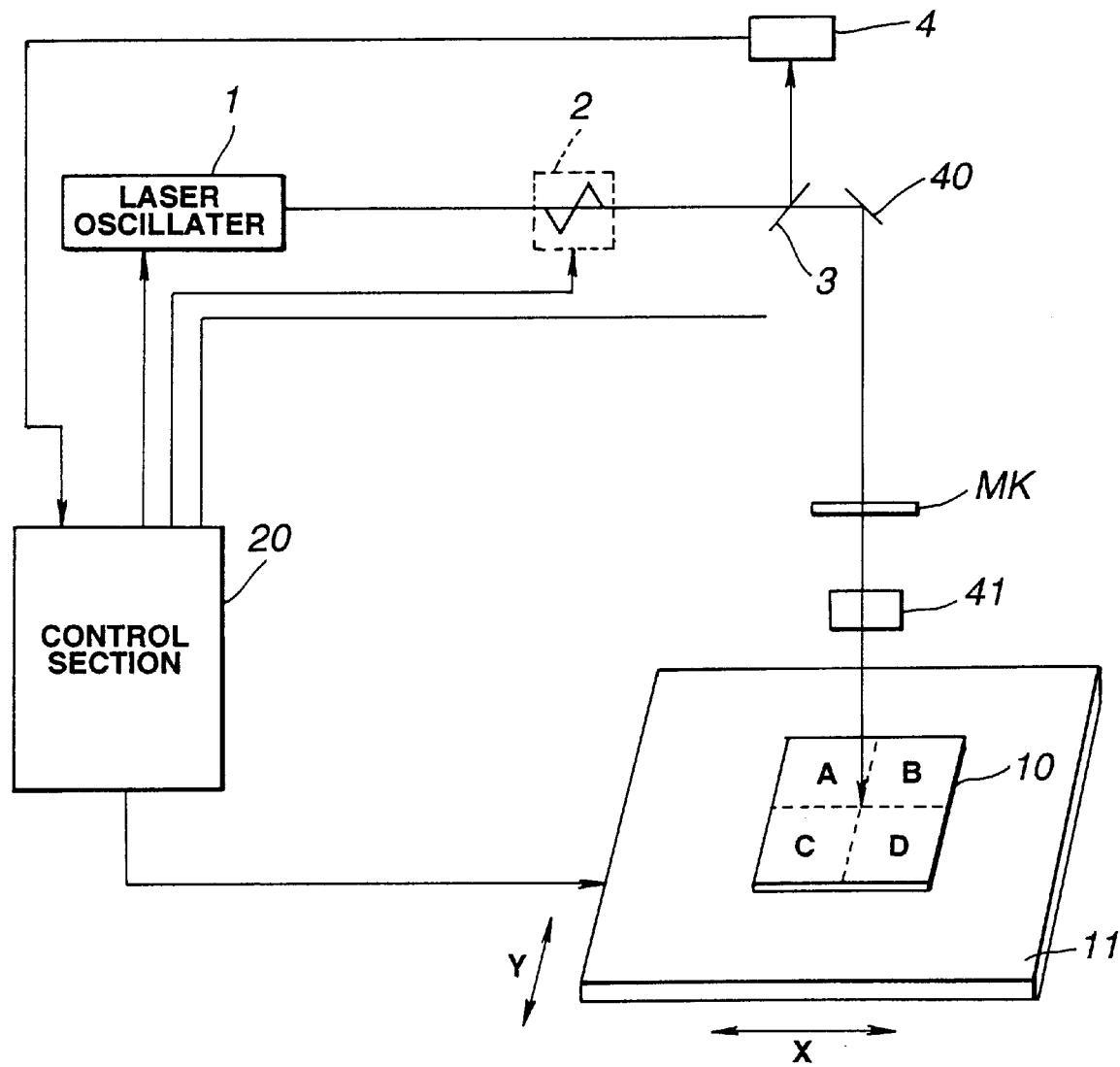
FIG. 6 is a diagram showing a third embodiment of the invention.

FIG. 6 depicts a third embodiment of the invention.

In the third embodiment, the laser scanner 5 is not used to scan by the laser light as in the previous embodiment, but the machining stage 11 is moved in directions X and Y two-dimensionally to adjust the laser irradiating positions on the work 10.

In FIG. 6, the excimer pulse laser light emitted from the laser head 1 of the excimer laser oscillator is irradiated to the work 10 positioned on the machining stage 11 through the shutter 2, the beam splitter 3, a deflection mirror 40, a beam forming mask MK and a lens 41.

In this case, the work 10 has four machining spots A, B, C and D.

Figure 7:
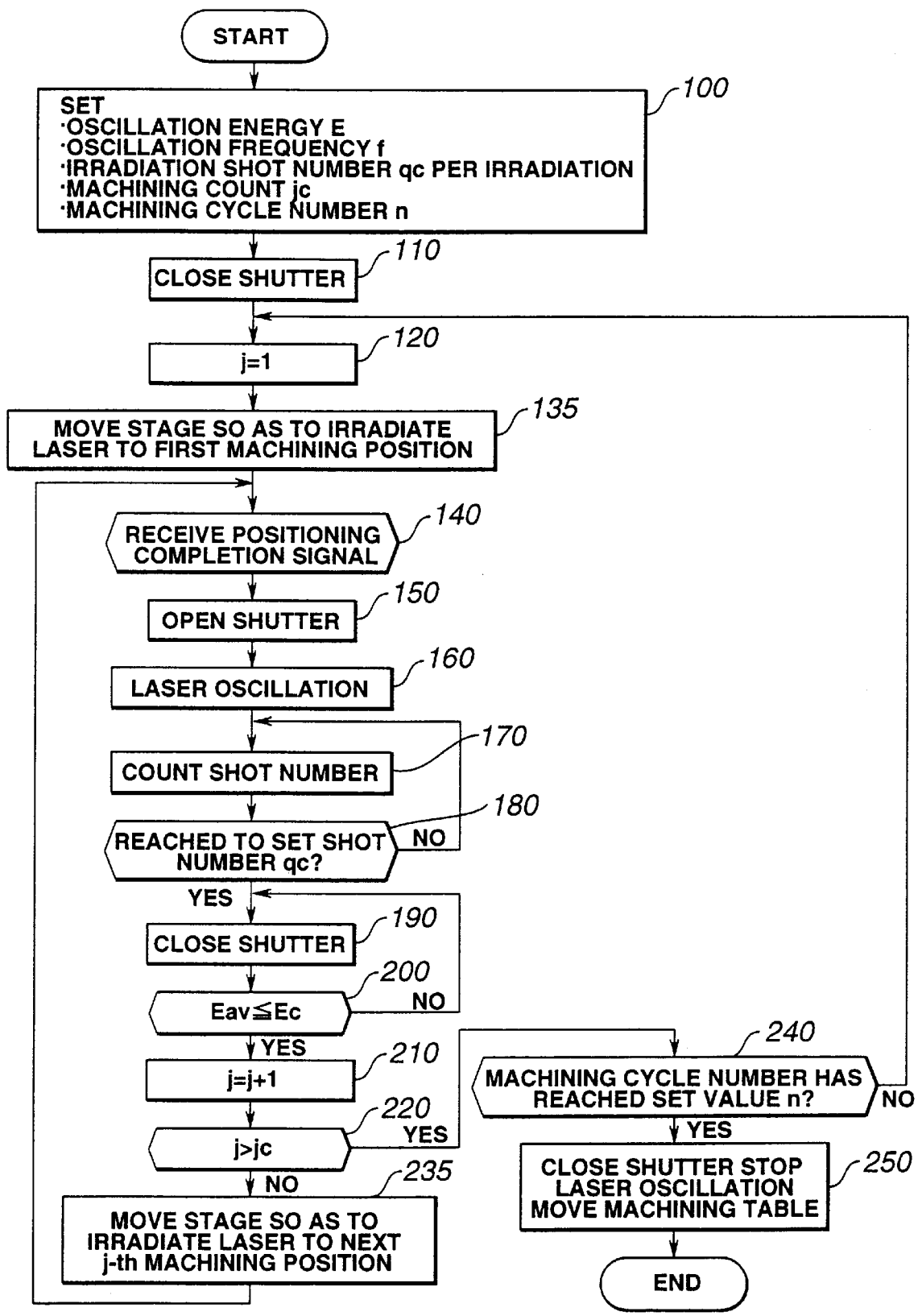
FIG. 7 is a flowchart showing laser machining according to the third embodiment.

FIG. 7 shows a laser machining procedure of the third embodiment. In the flowchart of FIG. 7, steps 135 and 235 replace steps 130 and 230 in the flowchart of FIG. 3, and the rest is the same as in the flowchart of FIG. 3.

Specifically, the third embodiment is not different from the previous embodiment on the point that the machining positions are laser drilled in a time division fashion so that the number of continuous irradiation times with respect to each machining spot does not exceed the predetermined value qc. But, the machining stage 11 is moved in the third embodiment instead of shifting the laser irradiation positions.

Figure 8:
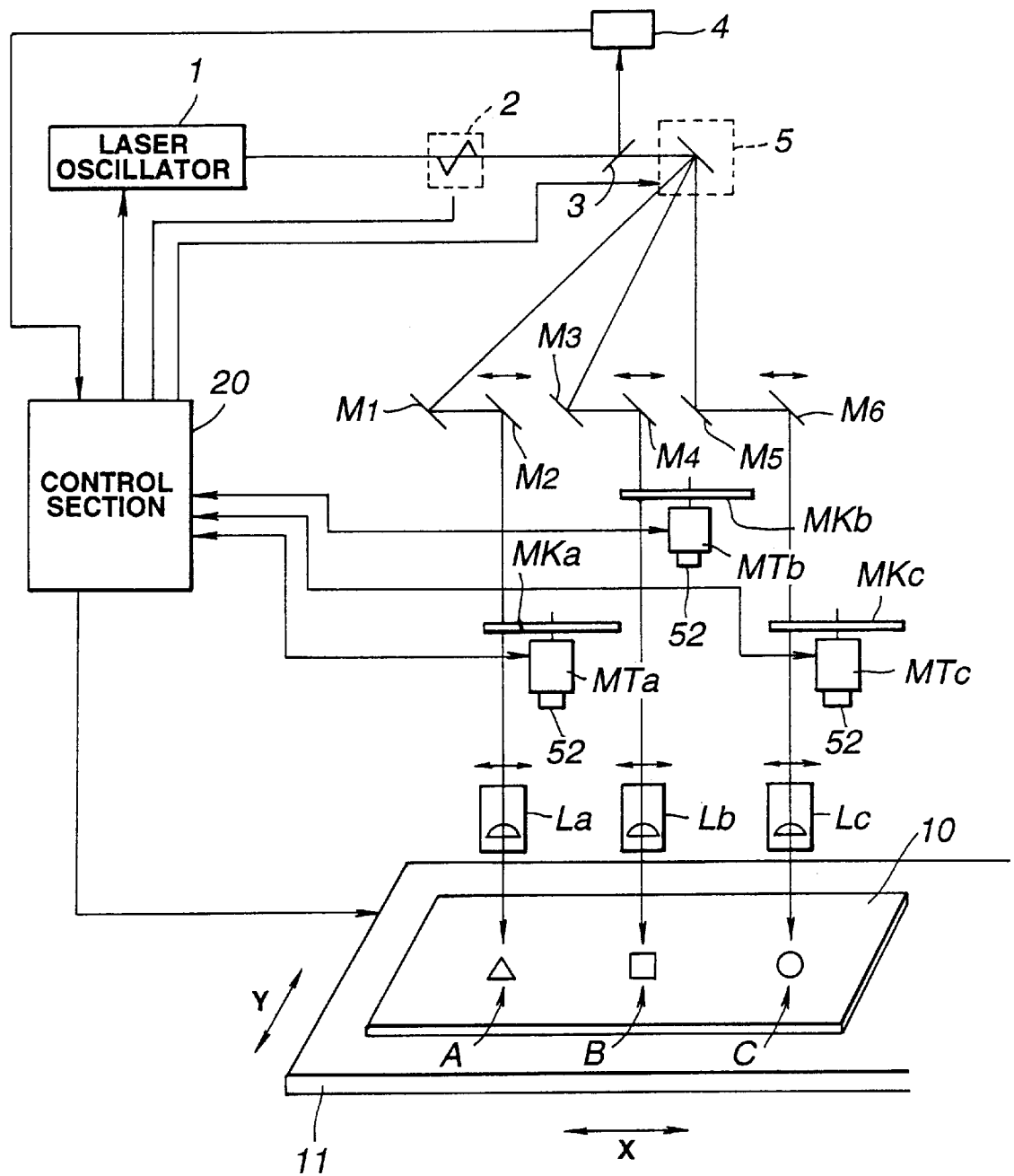
FIG. 8 is a diagram showing a fourth embodiment of the invention.

FIG. 8 depicts a fourth embodiment of the invention.

In the fourth embodiment, beam forming masks MKa to MKc are disposed in the laser light paths. Each mask is a rotary mask made of a mask plate 51 having a plurality of light passing holes (mask patterns) 50 with various shapes and sizes. And, the rotary masks MKa to MKc are rotated by motors MTa to MTc respectively to select mask patterns 50 (50a, 50b) having desired shapes and sizes and to position them in the laser light paths. An encoder 52 is disposed on the revolving shafts of the motors MTa to MTc. And the control section 20 controls to feed back the revolving position signals of the motor shafts detected by the encoders 52 to rotate and position the rotary masks MKa to MKc.

In this case, the rotary masks MKa to MKc have the mask patterns 50 formed on two circles (concentrically) having a different radius, and when the mask patterns 50a on the outer circle are selected, the laser is irradiated to a hatched position Xa, and when the mask patterns 50b on the inner circle are selected, the laser is irradiated to a hatched position Xb. Reference numeral 53 is the center of revolution.

Specifically, as shown in FIG. 8, in the respective light paths (three of them in this case) deflected by the laser scanner 5 are disposed stationary vender mirrors M1, M3 and M5, movable vender mirrors M2, M4 and M6, beam forming masks MKa to MKc and movable imaging lenses La to Lc, and the laser light is irradiated to the work 10 through them. The movable vender mirrors M2, M4 and M6 and the movable imaging lenses La to Lc are slidable in direction X. Thus, the laser light paths are changed to irradiate the laser light to two irradiation positions Xa, Xb on the masks MKA to MKc.

Figure 9:
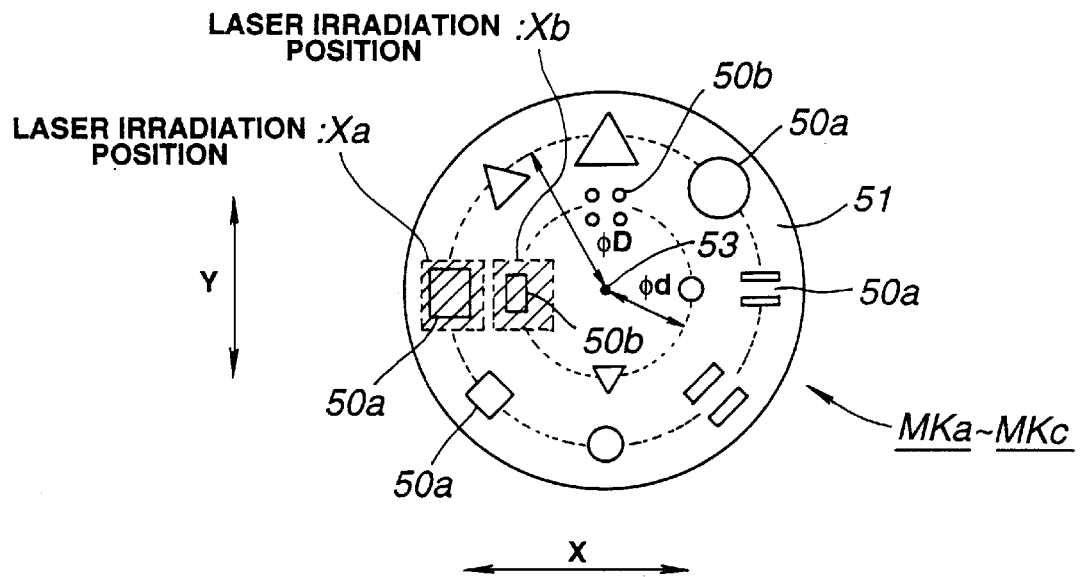
FIG. 9 is a diagram showing a beam forming mask used in the fourth embodiment.

The movable vender mirrors M2, M4 and M6 and the movable imaging lenses La to Lc are moved by the control section 20 in synchronization with the scanning operation of the laser scanner 5. As shown in FIG. 9, when it is assumed that the inner circle has a radius $\phi d$ and the outer circle has a radius D, the movable vender mirrors M2, M4 and M6 and the movable imaging lenses La to Lc travel a distance $\phi D-\phi d$ when the irradiation positions Xa, Xb are switched.

Thus, in the fourth embodiment, the beam forming masks MKa to MKc having the multiple different mask patterns are used and rotated to enable instantaneous selection of a desired mask pattern, eliminating the necessity of replacing masks to change the mask patterns and improving an operating efficiency.

In this embodiment, the machining positions are laser drilled in a time division fashion so that the number of continuous irradiation times with respect to each machining spot does not exceed the predetermined value qc in the same manner as in the first embodiment. Thus, an adverse effect of heat is prevented, and the laser machining can be made with high precision.

Figure 10:
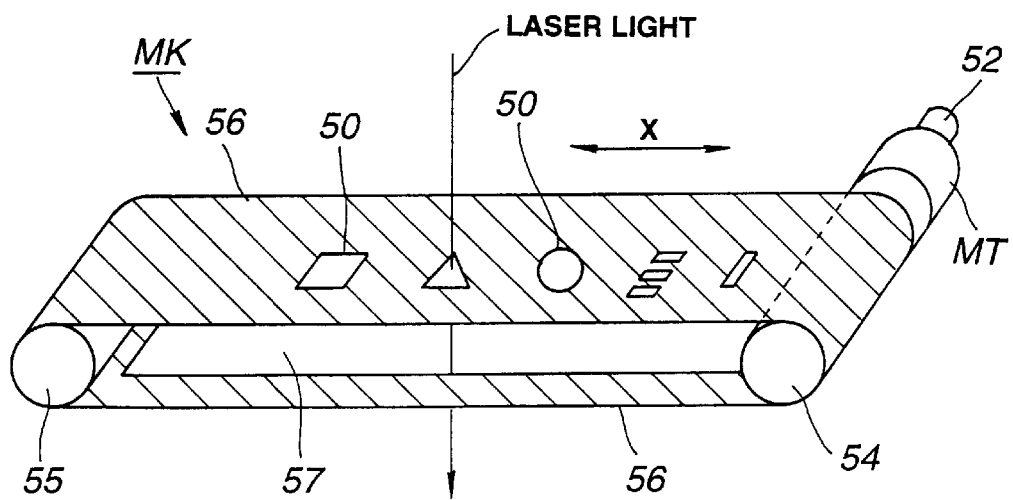
FIG. 10 is a diagram showing a modified beam forming mask used in the fourth embodiment.

FIG. 10 depicts a modification of the beam forming masks MKa to MKc used in the embodiment shown in FIG. 8. It is seen that the mask is not rotated but slidably moved to select a desired mask pattern.

Specifically, a sheet mask 56 is wound around a drive roller 54 and a tension roller 55. The drive roller 54 is connected to the rotational shaft of a motor MT to which an encoder 52 is mounted. And the sheet mask 56 also has a plurality of various shaped mask patterns 50 formed in a one-dimensional direction. The sheet material 56 has an oblong hole 57 formed on it back side located below the mask patterns 50 so to pass the laser light.

Therefore, the motor MT is driven to slide the sheet material 56 in direction X so to position a desired mask pattern above the laser irradiation position.

The beam forming masks shown in FIG. 9 and FIG. 10 may be applied to the third embodiment shown in FIG. 6.

When the sheet mask shown in FIGS. 10 is used in the structure shown in FIG. 8, it is not necessary to slidably move the movable vender mirrors M2, M4 and M6 and the movable imaging lenses La to Lc.

In the above-described embodiments, the number of machining cycles n was determined and the laser machining was terminated when machining was completed for the number of machining cycles n. It may be designed that the total number of irradiation times Qt required to cut a single spot is determined in advance, and when a total counted value of laser shot number to respective machining spots reaches the total number of predetermined irradiation times Qt, the laser cutting of the pertinent machining spot is automatically terminated.

In the above embodiment, when the laser shot number to a single machining spot reaches the predetermined value qc, the laser irradiation is performed sequentially to all other machining spots and then the laser irradiation is restarted to the pertinent machining spot, but the laser light is irradiated in arbitrary order. In other words, at least one laser irradiation to another machining spot may be inserted one time between the continuous laser irradiation in a certain cycle to a single machining spot and the laser irradiation in the next cycle.

In the above embodiment, the continuous irradiation time to a single machining spot in one operation is limited by the laser shot number of the pulse laser. But, it may be designed that a continuous irradiation time Tc to a single machining spot in one operation is determined previously, the continuous irradiation is actually counted when the laser is irradiated to the respective machining spots, and the counted continuous irradiation time is compared with the predetermined time Tc to limit the laser irradiation time.

And, when the laser irradiation to a single machining spot in one operation is limited by the continuous irradiation time Tc, the invention can be applied to not only the pulse laser light but also the continuous light laser.

What is claimed is:

1. A laser machining system for machining a plurality of variable machining spots on a work, comprising:
   a laser oscillator for generating laser light;
   laser light scanner means for deflecting the laser light generated from the laser oscillator so as to sequentially irradiate the laser light to the plurality of variable machining spots on the work;
   means for determining an optimal laser irradiation time for avoiding heat distortion;
   irradiation time setting means for setting said optimal laser irradiation time for machining one machining spot on the work in one operation; and
   control means for controlling the laser light scanning means to sequentially move the machining spots in a set order so that the laser irradiation time to machine each machining spot in one operation does not exceed the optimal laser irradiation time.

2. The laser machining system according to claim 1, further comprising shutter means, which is disposed between the laser oscillator and the laser light scanner means, for switching between allowance and interruption of the laser light, wherein:
   the control means closes the shutter means when the machining spots are changed by the laser light scanner means.

3. The laser machining system according to claim 2, further comprising laser light output detecting means for detecting output energy of the laser light after passing the shutter means, wherein:
   the control means starts to shift the machining spots by the laser light scanner means when the detected output energy is smaller than a given set value.

4. The laser machining system according to claim 1, wherein:
   the laser oscillator generates pulse laser light;
   the irradiation time setting means sets the number of continuous shots to machine a single machining spot on the work in one operation; and
   the control means controls the laser light scanner means to sequentially move the machining spot so that the number of continuous shots for machining a single machining spot does not exceed the set shot number.

5. The laser machining system according to claim 1, wherein the control means controls the laser light scanner means so that the laser irradiation to each machining spot for the optimal irradiation time in set sequential order is repeated in a plurality of cycles.

6. The laser machining system according to claim 1, further comprising:
   a mask which is disposed in the laser light path between the work and the laser light scanner means and has a plurality of light passing holes with various shapes or sizes formed on the same circumference; and
   revolving means for rotating the marks about the center of the circumference to position one of the plurality of light passing holes in the laser light path.

7. The laser machining system according to claim 1, further comprising:
   a sheet mask which is disposed in the laser light path between the work and the laser light scanner means and has a plurality of light passing holes with various shapes or sizes formed in one-dimensional direction; and
   slide means for sliding the sheet mask in the direction that the light passing holes are formed to position one of the plurality of light passing holes in the laser light path.

8. A laser machining system for machining a plurality of variable machining spots on a work, comprising:
   a laser oscillator for generating laser light;
   a movable stage which has the work placed on it and is moved to sequentially irradiate a plurality of different machining spots on the work with the laser light generated from the laser oscillator;
   means for determining an optimal laser irradiation time for preventing heat damage;
   irradiation time setting means for setting said optimal laser irradiation time for machining of a single machining spot on the work in one operation without heat distortion; and
   control means for controlling the movable stage to sequentially move the machining spots in a set order so that the laser irradiation time to machine each machining spot in one operation does not exceed the set optimal laser irradiation time.

9. The laser machining system according to claim 8, further comprising shutter means, which is disposed between the laser oscillator and the work, for switching between allowance and interruption of the laser light path, wherein:
   the control means controls to close the shutter means when the machining spots are changed by the movable stage.

10. The laser machining system according to claim 9, further comprising laser light output detecting means for detecting output energy of the laser light after passing the shutter means, wherein:
    the control means starts to shift the machining spots by the movable stage when the detected output energy is smaller than a given set value.

11. The laser machining system according to claim 8, wherein:
    the laser oscillator generates pulse laser light;
    the irradiation time setting means sets the number of continuous shots to machine a single machining spot on the work in one operation; and
    the control means controls to move the movable stage to sequentially move the machining spot so that the laser shot number for machining one machining spot in one operation does not exceed the set shot number.

12. The laser machining system according to claim 8, wherein the control means moves the movable stage so that the laser irradiation to each machining spot for the set irradiation time in the previously set order is repeated in a plurality of cycles.

13. The laser machining system according to claim 8, further comprising:
    a mask which is disposed in the laser light path between the laser oscillator and the work and has a plurality of light passing holes with various shapes or sizes formed on the same circumference; and
    revolving means for totaling the mark about he center of the circumference to opposition one of the plurality of light passing holes in the laser light path.

14. The laser machining system according to claim 8, further comprising:
    a sheet mask which is deposed in the laser light path between the laser oscillator and the work and has a plurality of light passing holes with various shapes or sizes formed in one-dimensional direction; and
    slide means for sliding the sheet mask in the direction that the light passing holes are formed to position one of the plurality of light passing holes in the laser light path.

* * * * *